(12) United States Patent
Ni et al.

(10) Patent No.: US 11,251,300 B2
(45) Date of Patent: Feb. 15, 2022

(54) SEMICONDUCTOR DEVICE AND METHOD OF MANUFACTURING SEMICONDUCTOR DEVICE

(71) Applicants: NISSAN MOTOR CO., LTD., Yokohama (JP); RENAULT S.A.S., Boulogne-Billancourt (FR)

(72) Inventors: Wei Ni, Kanagawa (JP); Toshiharu Marui, Kanagawa (JP); Ryota Tanaka, Kanagawa (JP); Tetsuya Hayashi, Kanagawa (JP); Shigeharu Yamagami, Kanagawa (JP); Keiichiro Numakura, Kanagawa (JP); Keisuke Takemoto, Kanagawa (JP); Yasuaki Hayami, Kanagawa (JP)

(73) Assignees: NISSAN MOTOR CO., LTD., Yokohama (JP); RENAULT S.A.S., Boulogne-Billancourt (FR)

( * ) Notice: Subject to any disclaimer, the term of this patent is extended or adjusted under 35 U.S.C. 154(b) by 0 days.

(21) Appl. No.: 17/047,438

(22) PCT Filed: Apr. 19, 2018

(86) PCT No.: PCT/IB2018/000563
§ 371 (c)(1),
(2) Date: Oct. 14, 2020

(87) PCT Pub. No.: WO2019/202350
PCT Pub. Date: Oct. 24, 2019

(65) Prior Publication Data
US 2021/0159335 A1 May 27, 2021

(51) Int. Cl.
*H01L 29/78* (2006.01)
*H01L 29/06* (2006.01)
(Continued)

(52) U.S. Cl.
CPC ...... *H01L 29/7825* (2013.01); *H01L 29/0696* (2013.01); *H01L 29/0865* (2013.01);
(Continued)

(58) Field of Classification Search
CPC ............ H01L 29/0696; H01L 29/7825; H01L 29/4236; H01L 29/66734; H01L 29/66704;
(Continued)

(56) References Cited

U.S. PATENT DOCUMENTS 7,576,388 B1 * 8/2009 Wilson ................ H01L 29/0847
257/330
7,799,667 B2 * 9/2010 Shiraki ............... H01L 29/7824
438/589

(Continued)

FOREIGN PATENT DOCUMENTS

EP 3 584 824 A1 12/2019
JP 2006-303543 A 11/2006
(Continued)

*Primary Examiner* — Bilkis Jahan
*Assistant Examiner* — Victor V Barzykin
(74) *Attorney, Agent, or Firm* — Foley & Lardner LLP

(57) ABSTRACT

A semiconductor device includes: a substrate; a drift region disposed on a principal surface of the substrate; a first well region extending from a second principal surface of the drift region in a direction perpendicular to the second principal surface and having a bottom portion; a second well region being in contact with the bottom portion and disposed at a portion inside the substrate located below the bottom portion; and a source region extending in a perpendicular direction from a region of the second principal surface provided with the first well region, and reaching the second well region. In a direction parallel to the second principal surface and oriented from a source electrode to a drain electrode, a distance of the second well region in contact (Continued)

with a gate insulating film is shorter than a distance of the first well region in contact with the gate insulating film.

8 Claims, 10 Drawing Sheets

(51) Int. Cl.
 *H01L 29/10* (2006.01)
 *H01L 29/66* (2006.01)
 *H01L 29/417* (2006.01)
 *H01L 29/08* (2006.01)
 *H01L 29/423* (2006.01)
 *H01L 21/04* (2006.01)

(52) U.S. Cl.
 CPC ...... *H01L 29/1041* (2013.01); *H01L 29/1095* (2013.01); *H01L 29/41766* (2013.01); *H01L 29/4236* (2013.01); *H01L 29/66068* (2013.01); *H01L 29/66659* (2013.01); *H01L 29/66704* (2013.01); *H01L 29/66734* (2013.01); *H01L 29/7835* (2013.01); *H01L 21/047* (2013.01)

(58) Field of Classification Search
 CPC ........... H01L 29/41766; H01L 29/0865; H01L 29/7835; H01L 29/66659; H01L 29/1041; H01L 29/66068; H01L 29/1095
 See application file for complete search history.

(56) References Cited

U.S. PATENT DOCUMENTS

| | | | |
|---|---|---|---|
| 9,768,293 B1* | 9/2017 | Syue | H01L 29/0653 |
| 9,842,903 B2* | 12/2017 | Lu | H01L 29/4236 |
| 2005/0093060 A1* | 5/2005 | Murakami | H01L 29/7825 257/330 |
| 2009/0256212 A1* | 10/2009 | Denison | H01L 29/7825 257/408 |
| 2016/0099340 A1* | 4/2016 | Hsu | H01L 29/7825 257/339 |
| 2016/0181371 A1* | 6/2016 | Ni | H01L 21/26586 257/77 |
| 2018/0350980 A1* | 12/2018 | Castro | H01L 21/823857 |
| 2020/0020775 A1* | 1/2020 | Ni | H01L 29/7809 |

FOREIGN PATENT DOCUMENTS

| | | |
|---|---|---|
| WO | WO 98/59374 A2 | 12/1998 |
| WO | WO 2015/008550 A1 | 1/2015 |

* cited by examiner

SEMICONDUCTOR DEVICE AND METHOD OF MANUFACTURING SEMICONDUCTOR DEVICE

TECHNICAL FIELD

The present invention relates to a semiconductor device and a method of manufacturing a semiconductor device.

BACKGROUND ART

For example, disclosures in Patent Literature 1 to 3 have been known as semiconductor devices of background art. In a semiconductor device disclosed in Patent Literature 1, a drift region is formed on a substrate and a well region to form a channel is further formed in the drift region. Moreover, a source region and a drain region are formed in a perpendicular direction from a surface of the drift region.

Meanwhile, there has also been disclosed a concept of reducing electric field concentration occurring at an end portion of a well region by adopting a structure in which a well region extends in a depth direction of a drift region and an end portion of the well region extends further to the inside of a substrate.

CITATION LIST

Patent Literature

Patent Literature 1: International Publication No. WO2015/008550
Patent Literature 2: Japanese Patent Application Publication No. 2006-303543
Patent Literature 3: International Publication No. WO1998/059374

SUMMARY OF INVENTION

Although the conventional example disclosed in Patent Literature 1 can reduce the electric field concentration in the well region, this example can hardly reduce channel resistance because the well region is formed at a constant width.

The present invention has been made to solve the above-mentioned problem of the related art. An object of the invention is to provide a semiconductor device and a method of manufacturing a semiconductor device, which are capable of reducing channel resistance.

An aspect of the present invention provides a semiconductor device which includes: a substrate; a first conductivity-type drift region disposed on a principal surface of the substrate; a second conductivity-type first well region extending from a second principal surface of the drift region in a direction perpendicular to the second principal surface and having a bottom portion reaching inside of the substrate; a second conductivity-type second well region being in contact with the bottom portion and disposed at a portion inside the substrate located below the bottom portion; and a first conductivity-type source region extending in a perpendicular direction from a region of the second principal surface provided with the first well region, and reaching the second well region. In a direction parallel to the second principal surface and oriented from a source electrode to a drain electrode, a distance of the second well region in contact with a gate insulating film is shorter than a distance of the first well region in contact with the gate insulating film.

Advantageous Effects of Invention

According to the aspect of the present invention, it is possible to reduce channel resistance of a semiconductor device.

DESCRIPTION OF EMBODIMENTS

Embodiments of the present invention will be described below with reference to the drawings. In the following description of the drawings, identical or similar portions are denoted by identical or similar reference signs. Meanwhile, in the embodiments of the present invention, a "first conductivity type" and a "second conductivity type" represent polarities that are opposite to each other. Specifically, if the first conductivity type is N type, then the second conductivity type is P type. If the first conductivity type is the P type, then the second conductivity type is the N type. The following description will be given of a case where the first conductivity type is the N type and the second conductivity type is the P type. However, the first conductivity type may be the P type and the second conductivity type may be the N type. When the N type and the P type are changed over, the polarity of an applied voltage is reversed as well.

Moreover, in the description of the drawings, lengths in a height direction, a longitudinal direction, and a lateral direction of each semiconductor device are exaggerated in order to facilitate the understanding. In other words, ratios of the lengths in these directions do not coincide with those in actual devices.

Description of First Embodiment

Figure 1A:
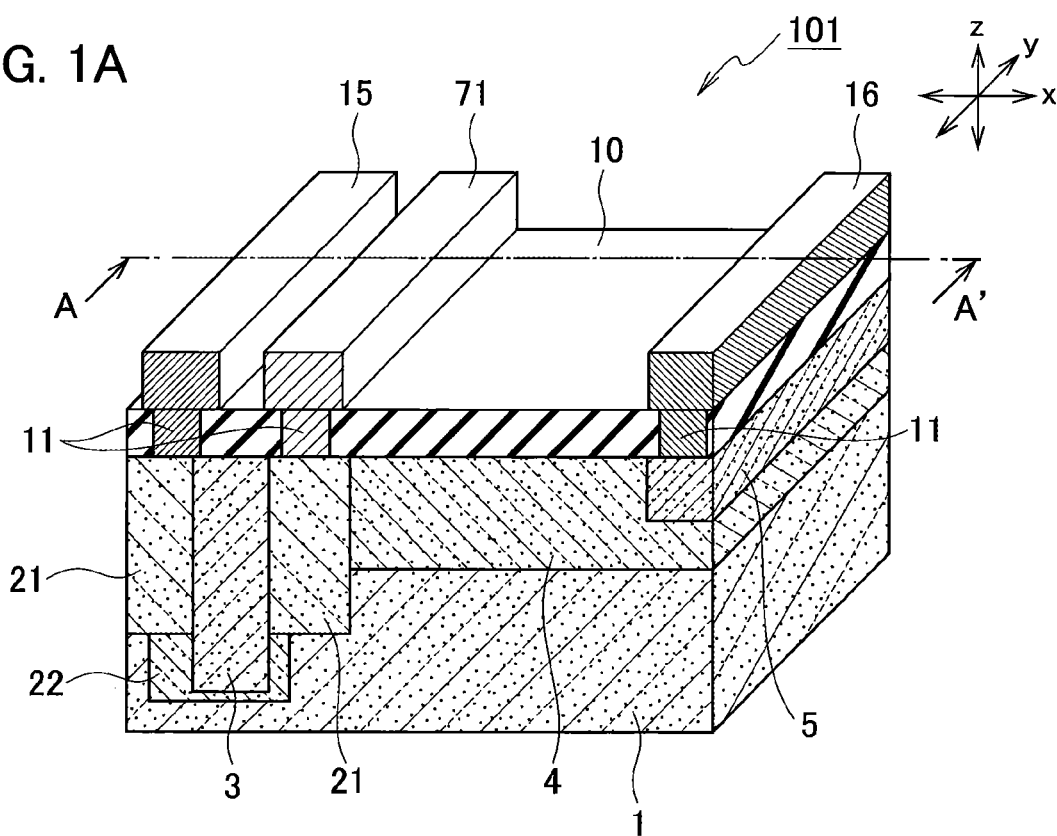
FIG. 1A is a perspective view showing a configuration of a semiconductor device according to a first embodiment of the present invention.
Figure 1B:
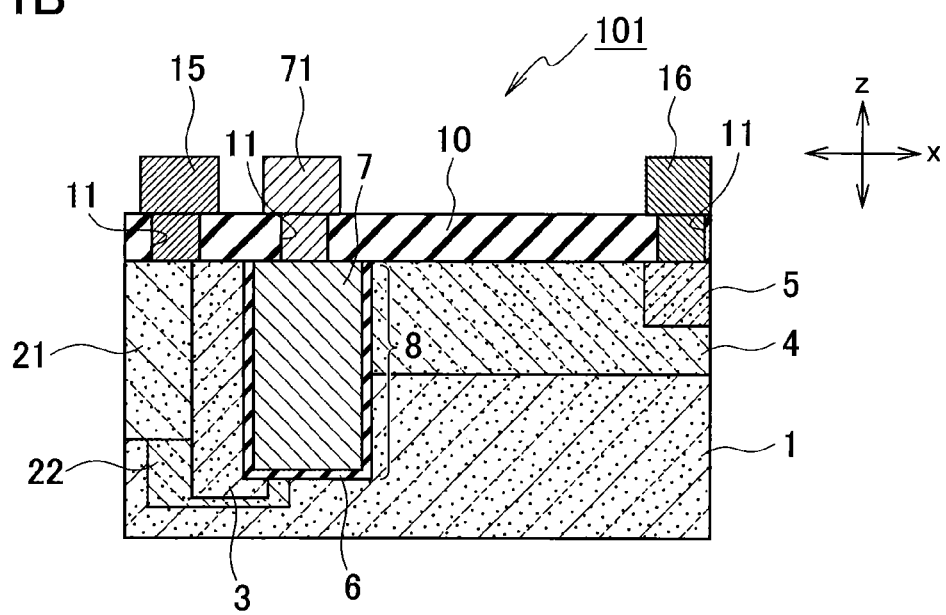
FIG. 1B is a cross-sectional view of the semiconductor device shown in FIG. 1A, which is taken along the A-A' line therein.
Figure 1C:
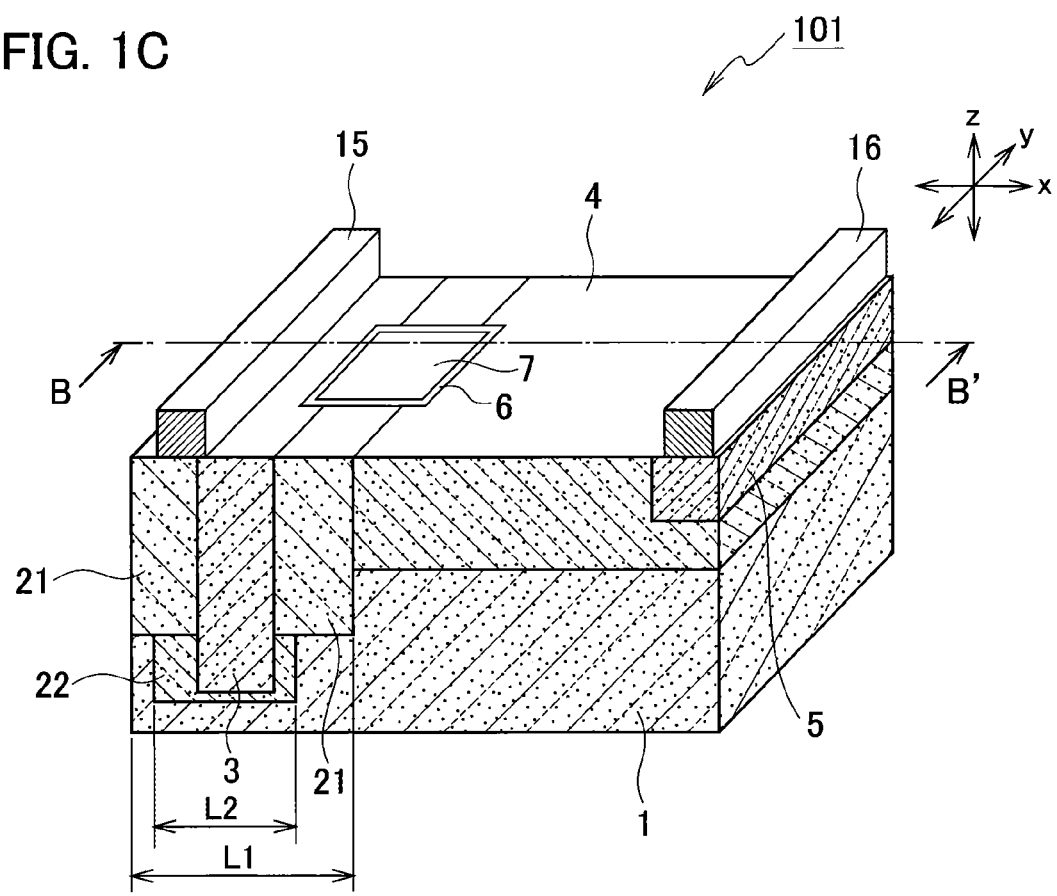
FIG. 1C is a perspective view showing an aspect after removing an interlayer insulating film from the semiconductor device shown in FIG. 1A.
Figure 1D:
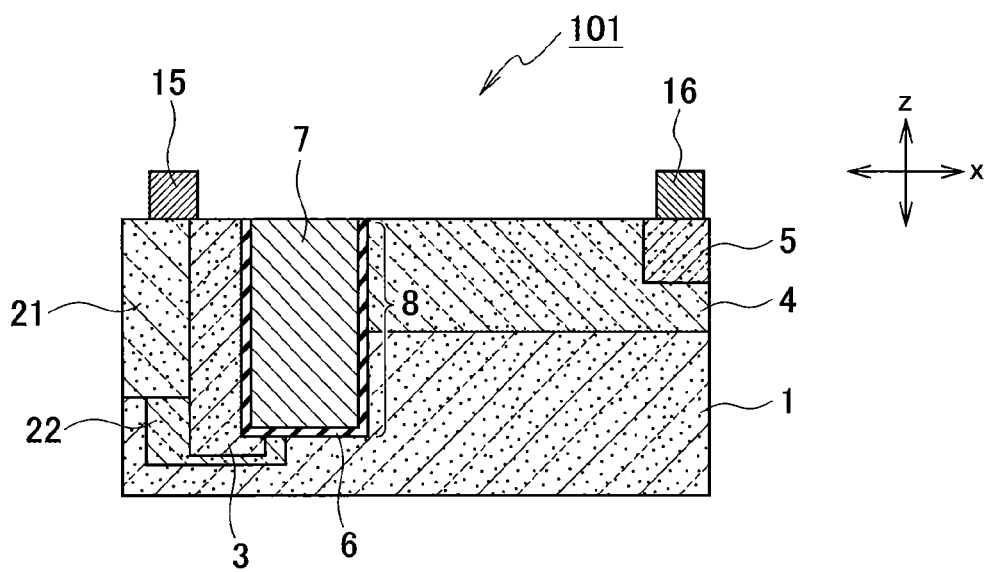
FIG. 1D is a cross-sectional view of the semiconductor device shown in FIG. 1C, which is taken along the B-B' line therein.

Now, a first embodiment of the present invention will be described. FIG. 1A is a perspective view showing a structure of a semiconductor device according to a first embodiment, and FIG. 1B is a cross-sectional view taken along the A-A' line in FIG. 1A. Meanwhile, FIG. 1C is a perspective view showing a state where an interlayer insulating film 10 and contact holes 11 are removed from FIG. 1A, and FIG. 1D is a cross-sectional view taken along the B-B' line in FIG. 1C. In the meantime, x axis, y axis, and z axis are defined as illustrated in FIGS. 1A to 1D.

As shown in FIG. 1C, a semiconductor device 101 according to the first embodiment includes an insulating semiconductor substrate 1, an N-type drift region 4 disposed on a principal surface (an upper principal surface in the drawing) of the substrate 1, and a P-type first well region 21 extending from a second principal surface (an upper principal surface in the drawing) of the drift region 4, which is located on an opposite side of a first principal surface being in contact with the principal surface of the substrate 1, in a direction perpendicular to the second principal surface and having a bottom portion reaching inside of the substrate 1.

The first well region 21 is formed on one end portion side (on a left side in the drawing) in one direction (an x-axis direction in FIG. 1C) parallel to the first principal surface of the drift region 4.

Moreover, the semiconductor device 101 includes a P-type second well region 22, which is in contact with the bottom portion of the first well region 21 and is disposed at a portion inside the substrate 1 located below the bottom portion of the first well region 21. The second well region 22 is formed such that its lateral width (a distance in the one direction) is shorter than that of the first well region 21. In other words, a distance L2 shown in FIG. 1C is shorter than a distance L1 therein. Note that the first well region 21 and the second well region 22 may be hereinafter collectively referred to as "well regions" as appropriate.

An N$^+$-type source region 3 is formed inside the first well region 21 in such a way as to extend in a perpendicular direction from a surface (a second principal surface) of the first well region 21. The source region 3 is formed to reach a position deeper than the bottom portion of the first well region 21 and shallower than a bottom portion of the second well region 22. In other words, the source region 3 extends in the perpendicular direction from a region of the second principal surface where the first well region 21 is formed, and reaches the second well region 22.

An N$^+$-type drain region 5 is formed (disposed) at an end portion (an end portion on a right side in the drawing) in one direction parallel to the second principal surface and on an opposite side of the source region 3 in such a way as to extend in a perpendicular direction from a second principal surface of the drift region 4. In other words, the N$^+$-type drain region 5 extending in the perpendicular direction from the second principal surface is formed in the drift region 4 away from the first well region 21 and the second well region 22.

A gate groove 8 that takes on a rectangular shape when viewed in a z-axis direction is formed at a region extending across the drift region 4, the first well region 21, and part of the source region 3. As shown in FIG. 1D, a lower end portion of the gate groove 8 reaches the second well region 22. Specifically, the gate groove 8 has a side surface exposed to the first well region 21, the second well region 22, the source region 3, and the drift region 4. Moreover, a gate insulating film 6 is formed on side surfaces of the gate groove 8. Meanwhile, the lower end portion of the gate groove 8 is located at a position shallower than lower end portions of the source region 3 and the second well region 22. As a consequence, the gate insulating film 6 provided on the side surfaces of the gate groove 8 is in contact with the first well region 21, the second well region 22, the source region 3, and the drift region 4.

In the meantime, bottom surfaces of the source region 3 and the second well region 22 are located deeper than the lower end portion of the gate groove 8. As a consequence, the area of the gate groove 8 in contact with the first well region 21 and the second well region 22 is proportional to the depth of the gate groove 8.

A gate electrode 7 is formed (disposed) inside the gate groove 8 through the gate insulating film 6. Accordingly, the gate electrode 7 is in contact with the first well region 21, the second well region 22, the source region 3, and the drift region 4 through the gate insulating film 6.

Figure 1E:
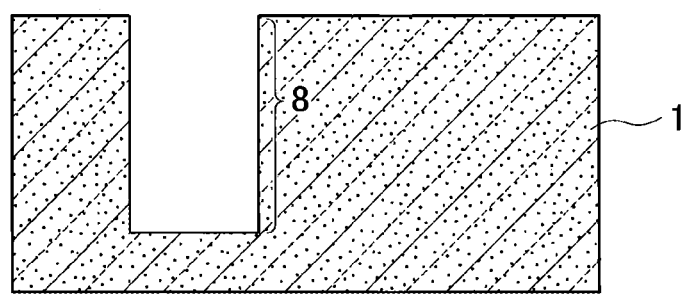
FIG. 1E is a cross-sectional view related to the first embodiment, which shows a state of forming a gate groove in a substrate.
Figure 1F:
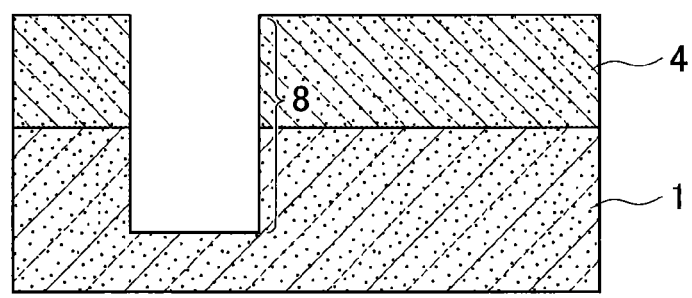
FIG. 1F is a cross-sectional view related to the first embodiment, which shows a state of forming a drift region subsequent to FIG. 1E.
Figure 1G:
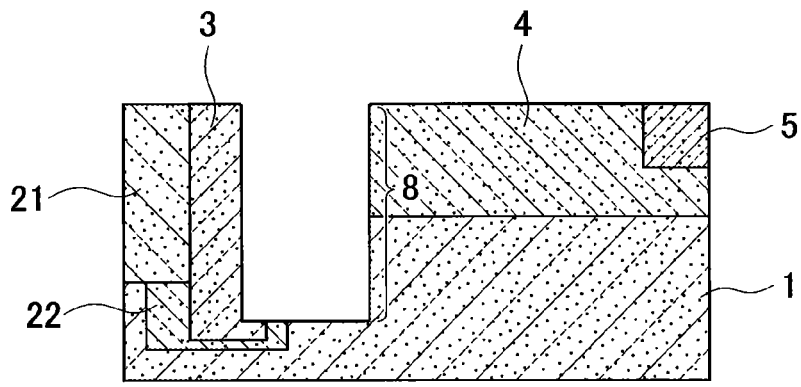
FIG. 1G is a cross-sectional view related to the first embodiment, which shows a state of forming well regions and a source region subsequent to FIG. 1F.
Figure 1H:
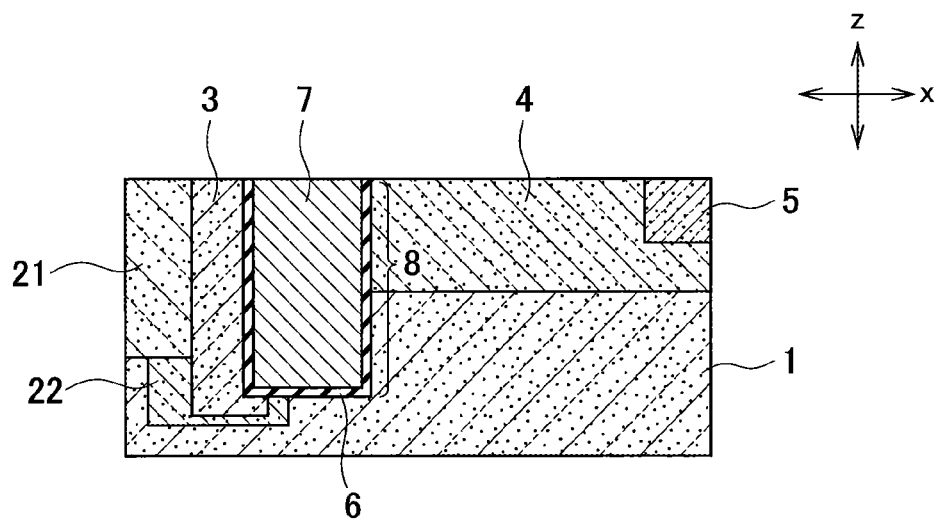
FIG. 1H is a cross-sectional view related to the first embodiment, which shows a state of forming a gate insulating film and a gate electrode subsequent to FIG. 1G.
Figure 1I:
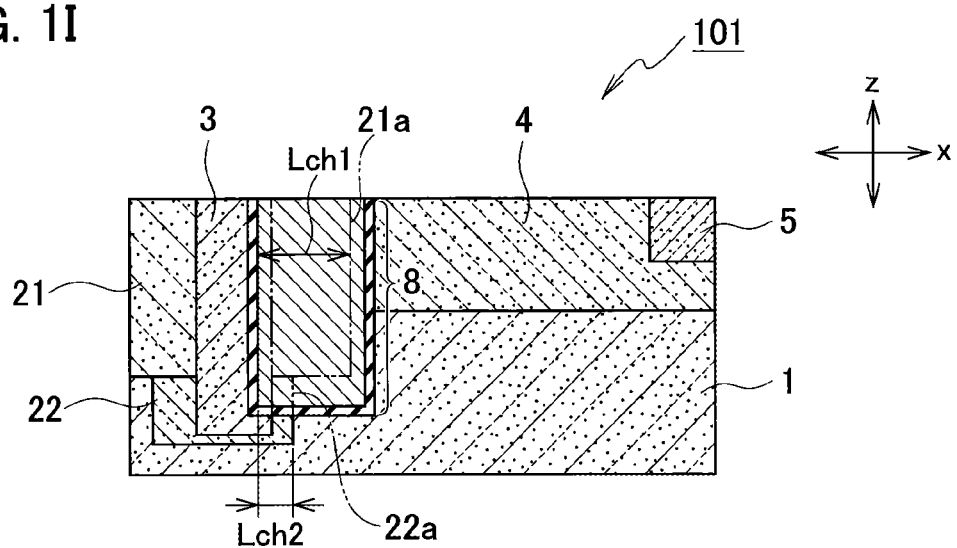
FIG. 1I is an explanatory diagram related to the first embodiment, which shows a region where a first well region and a second well region overlap the gate groove.

Moreover, in the direction parallel to the principal surface of the substrate 1, a length of a surface of contact of the gate insulating film 6 provided on a side surface of the gate groove 8 with the first well region 21 is larger than a length of a surface of contact of the gate insulating film 6 provided on the side surface of the gate groove 8 with the second well region 22. Specifically, FIG. 1I is an explanatory diagram showing the first well region 21 and the second well region 22 in contact with the side surface in the x-axis direction of the gate groove 8 in a cross-section of the semiconductor device 101, where a distance Lch2 in the x-axis direction of the second well region 22 in contact with the gate groove 8 is shorter than a distance Lch1 in the x-axis direction of the first well region 21 in contact with the gate groove 8. Note that reference sign 21a in the drawing denotes a region where the first well region 21 overlaps the gate groove 8 in the x-axis direction while reference sign 22a therein denotes a region where the second well region 22 overlaps the gate groove 8 in the x-axis direction.

Meanwhile, as shown in FIGS. 1A and 1B, the interlayer insulating film 10 is disposed on second principal surfaces of the drift region 4, the first well region 21, and the source region 3.

A source electrode 15, a gate wire 71, and a drain electrode 16 are formed on a surface of the interlayer insulating film 10. The source electrode 15 is coupled to the source region 3 and to the first well region 21 through a contact hole 11 formed in the interlayer insulating film 10.

The gate wire 71 is coupled to the gate electrode 7 through another contact hole 11. The drain electrode 16 is coupled to the drain region 5 through still another contact hole 11.

Specifically, the drain electrode 16 is electrically coupled to the drain region 5 while the source electrode 15 is electrically coupled to the source region 3 and the first well region 21. In the meantime, both the source region 3 and the first well region 21 are coupled to the source electrode 15. Accordingly, the source region 3 and the first well region 21 are set to the same electric potential.

In the first embodiment, the lateral width of the second well region 22 is set shorter than the lateral width of the first well region 21 in order to reduce channel resistance when the semiconductor device 101 is on. Now, a reason for this configuration will be described below.

It is desirable to set a larger channel width when the device is on in order to reduce the channel resistance. Accordingly, a contact area between the gate electrode 7 and the well regions is increased by providing the deeper gate groove 8 and forming the well regions deeper, whereby the channel width can be set larger. However, when a well region having a large width (a width in the x-axis direction in the drawing) is formed until reaching a deep position from the surface of the semiconductor device 101 by ion implantation, high implantation energy is required and a withstand voltage against a voltage during the implantation may fail to be maintained in some cases. In this case, the lateral width of the second well region 22 to be provided at the deep position is reduced while the lateral width of the first well region 21 to be provided at the shallow position is increased. In this way, it is possible to form the well regions deeper with low implantation energy.

Meanwhile, the second well region 22 is in contact with the insulative substrate 1 and an electric field to be applied is small when the device is off. Hence, it is possible to obtain a sufficient withstand voltage even when the lateral width is small.

Description of Manufacturing Method of First Embodiment

Next, a description will be given of a method of manufacturing the semiconductor device 101 according to the first embodiment shown in FIGS. 1A and 1B. This embodiment will describe an example in which the insulating semiconductor substrate 1 is made of silicon carbide (SiC). The insulating semiconductor mentioned herein means one having a resistivity of several kiloohms per centimeter or above. While there are several polytypes (crystalline polymorphs) of silicon carbide, a typical 4H type will be described herein.

To begin with, a mask material (not shown) is formed on the substrate 1 and patterned in order to form the gate groove 8 on a non-doped silicon carbide insulating semiconductor substrate (the substrate 1). A silicon oxide film can be used as the mask material while a thermal CVD process or a plasma CVD process can be used as a deposition method.

A general photolithography process can be used as a patterning method. The mask material is etched by using the patterned resist as a mask Wet etching employing hydrofluoric acid or dry etching such as reactive ion etching can be used as an etching method.

Then, the gate groove 8 is formed by using the mask material as a mask. A dry etching process can be used as a method of forming the gate groove 8. The mask material is removed after forming the gate groove 8. When the mask material is the silicon oxide film, for example, the mask material is removed by hydrofluoric acid washing. As a consequence, the substrate 1 provided with the gate groove 8 can be obtained as shown in FIG. 1E.

Next, the drift region 4 is formed on an upper surface of the substrate 1. The drift region 4 can be formed by implanting N-type impurity ions. An implantation concentration of the impurity is preferably set in a range from $1 \times 10^{14}$ to $1 \times 10^{18}$ cm$^{-3}$. The implantation energy can be set depending on the required depth of the drift region 4. For example, when the depth of the drift region 4 is 1 μm, a voltage in mega-electron-volt (MeV) order is necessary. As a consequence, the drift region 4 is formed on the upper surface of the substrate 1 as shown in FIG. 1F.

Thereafter, the first well region 21, the second well region 22, the N-type source region 3, and the N-type drain region 5 are formed by ion implantation from the surface (the second principal surface) of the drift region 4. The source region 3 and the drain region 5 are formed simultaneously. In this instance, a mask material is formed on the drift region 4 for patterning ion implantation regions.

A silicon oxide film can be used as the mask material while a thermal CVD process or a plasma CVD process can be used as a deposition method.

Next, a resist is patterned on the mask material (not shown). A general photolithography process can be used as a patterning method. The mask material is etched by using the patterned resist as a mask. Wet etching employing hydrofluoric acid or dry etching such as reactive ion etching can be used as an etching method.

Thereafter, the resist is removed by using oxygen plasma, sulfuric acid, and the like. P-type and N-type impurities are ion implanted by using the mask material as a mask, thus forming the P-type first well region 21, the P-type second well region 22, and the N$^+$-type source region 3.

Aluminum or boron can be used as the P-type impurity. Meanwhile, nitrogen can be used as the N-type impurity. In this instance, development of crystal defects in the implantation regions can be suppressed by conducting the ion implantation while heating a base at a temperature of about 600° C.

The second well region 22 can be formed at the deeper position than the first well region 21 by setting the implantation energy when forming the second well region 22 higher than the implantation energy when forming the first well region 21.

Moreover, since the lateral width of the second well region 22 is made shorter than the lateral width of the first well region 21 as described above, it is possible to reduce the implantation energy when forming the well regions. For example, the implantation energy becomes high if the well regions are formed down to the bottom portion of the second well region 22 while keeping the lateral width of the first well region 21. However, it is possible to form the well regions to the deep position without requiring the high implantation energy by setting the small lateral width of the second well region 22.

An impurity concentration in each of the first well region 21 and the second well region 22 is preferably set in a range from $1 \times 10^{16}$ to $5 \times 10^{18}$ cm$^{-3}$. After the ion implantation, the mask material is removed by etching while using hydrofluoric acid or the like. FIG. 1G shows a cross-sectional view in a state after the first well region 21, the second well region 22, the source region 3, and the drain region 5 are formed.

Meanwhile, each of the source region 3 and the drain region 5 formed in accordance with the above-described method preferably has the impurity concentration in a range from $1 \times 10^{18}$ to $1 \times 10^{21}$ cm$^{-3}$. Moreover, each of the first well region 21 and the second well region 22 preferably has the impurity concentration in a range from $1\times10^{15}$ to $1\times10^{19}$ cm$^{-3}$. The depth of the second well region 22 is preferably set deeper than the lower end portion of the gate groove 8.

Thereafter, the ion implanted impurities are activated by conducting a heat treatment. A heat treatment temperature is preferably set to a temperature around 1700° C. It is preferable to use argon or nitrogen as an atmosphere.

Next, the gate insulating film 6 is formed on an inner surface of the gate groove 8. A thermal oxidation process or a deposition process can be adopted as a method of forming the gate insulating film 6. In the case of the thermal oxidation process, for example, the silicon oxide film can be formed on all portions of a base exposed to oxygen by heating the base to a temperature of about 1100° C. in an oxygen atmosphere.

After the gate insulating film 6 is formed, annealing at about 1000° C. in an atmosphere of nitrogen, argon, N$_2$O, or the like may be carried out in order to reduce interface states of the first well region 21, the second well region 22, and the gate insulating film 6. Meanwhile, it is also possible to conduct thermal oxidation directly in an atmosphere of NO or N$_2$O. The temperature in that case is preferably set in a range from 1100° C. to 1400° C. A thickness of the formed gate insulating film 6 is preferably set to several tens of nanometers.

Next, the gate electrode 7 is deposited into the gate groove 8. Polycrystalline silicon is a typical material to form the gate electrode 7 and this embodiment will describe the case of using the polycrystalline silicon.

A low-pressure CVD process can be used as a method of depositing the polycrystalline silicon. A deposition thickness of the polycrystalline silicon is set to a value larger than a half of the width of the gate groove 8. This makes it possible to fill the gate groove 8 completely with the polycrystalline silicon.

When the width of the gate groove 8 is 2 µm, for example, the thickness of the polycrystalline silicon is set larger than 1 Meanwhile, by annealing at 950° C. in POCl$_3$ after the deposition of the polycrystalline silicon, it is possible to form the N-type polycrystalline silicon and thus to impart a conductivity to the gate electrode 7.

Next, the polycrystalline silicon serving as the gate electrode 7 is subjected to etching. Isotropic etching or anisotropic etching can be adopted as an etching method. An amount of etching is set such that the polycrystalline silicon remains in the gate groove 8. For example, when the polycrystalline silicon is deposited in a thickness of 1.5 µm in the gate groove 8 having the width of 2 µm, the amount of etching is preferably set to 1.5 µm. In the meantime, over-etching of several percent relative to 1.5 µm is allowable in light of etching control. FIG. 1H shows a cross-sectional structure after etching the polycrystalline silicon.

Next, the interlayer insulating film 10 is formed and the contact holes 11 for the electrodes are further formed therein. A silicon oxide film can be used as the interlayer insulating film 10. A thermal CVD process or a plasma CVD process can be used as a method of depositing the interlayer insulating film 10. A thickness of the interlayer insulating film 10 is preferably set to 1 µm or above. After the deposition of the interlayer insulating film 10, the contact holes 11 are formed starting from a surface of the interlayer insulating film 10.

A resist (not shown) is patterned on the interlayer insulating film 10 in order to form the contact holes 11. A general photolithography process can be used as a patterning method. The interlayer insulating film 10 is etched by using the patterned resist as a mask. Wet etching employing hydrofluoric acid or dry etching such as reactive ion etching can be used as an etching method. Next, the resist is removed by using oxygen plasma, sulfuric acid, and the like. The contact hole 11 for the source electrode 15 is formed in such a way as to expose the first well region 21 and the source region 3 at the same time.

The source electrode 15 and the drain electrode 16 are formed after the formation of the contact holes 11. Any of titanium Ti, nickel Ni, and molybdenum Mo can be used as an electrode material. Alternatively, it is also possible to use layered metal such as Ti/Ni/Ag. When titanium Ti is used as the electrode material, titanium Ti is first deposited on the surface of the interlayer insulating film 10. A sputtering process can be used as a deposition method. The source electrode 15, the drain electrode 16, and the gate wire 71 shown in FIGS. 1A and 1B can be formed by subjecting deposited titanium Ti to selective etching by use of a resist mask. In this way, it is possible to manufacture the semiconductor device 101 shown in FIGS. 1A and 1B.

Description of Operations of First Embodiment

Next, operations of the semiconductor device 101 according to the first embodiment will be described. The semiconductor device 101 having the configuration shown in FIG. 1A functions as a transistor by controlling an electric potential of the gate electrode 7 in a state where a positive electric potential is applied to the drain electrode 16 based on an electric potential of the source electrode 15.

Specifically, when a voltage between the gate electrode 7 and the source electrode 15 is set equal to or above a predetermined threshold voltage, an inversion layer is formed on each of channels of the first well region 21 and the second well region 22 in contact with side surfaces of the gate electrode 7 through the gate insulating film 6. Hence, the semiconductor device 101 is set to an on-state.

Accordingly, a current flows from the drain electrode 16 to the source electrode 15. To be more precise, electrons flow from the source electrode 15 to the source region 3, and moreover, flow from the source region 3 to the drift region 4 through the channels formed in the first well region 21 and the second well region 22. Furthermore, the electrons flow from the drift region 4 to the drain electrode 16 through the drain region 5.

In this instance, since the second well region 22 is formed deeper than the gate groove 8, it is possible to expand the channel width and thus to reduce the channel resistance.

On the other hand, when the voltage between the gate electrode 7 and the source electrode 15 is set below the predetermined threshold voltage, the inversion layers disappear and the semiconductor device 101 is set to an off-state. Accordingly, the current flowing from the drain electrode 16 to the source electrode 15 is shut off. When the semiconductor device 101 is off, a high voltage in a range from several hundred to several thousand volts is applied between the drain electrode 16 and the source electrode 15.

In this instance, since the lateral width of the second well region 22 is smaller than that of the first well region 21, a distance between the second well region 22 and the drain region 5 becomes longer than a distance between the first well region 21 and the drain region 5. For this reason, an electric field applied to the second well region 22 is smaller than an electric field applied to the first well region 21. Meanwhile, a width of a depletion layer region formed in the second well region 22 is smaller than a width of a depletion layer region formed in the first well region 21 and a punch-through is therefore less likely to develop. As a consequence, it is possible to avoid reduction in withstand voltage even when the lateral width of the second well region 22 is small.

Description of Effects of First Embodiment

The semiconductor device 101 according to the first embodiment can achieve the following effects.

The first well region 21 and the second well region 22 are provided and the lateral width (the distance in the x-axis direction in FIG. 1A) of the second well region 22 is formed smaller than the lateral width of the first well region 21. Accordingly, it is possible to form the well regions by the ion implantation without requiring high implantation energy.

Meanwhile, by providing the first well region 21 and the second well region 22, it is possible to increase the contact area in the depth direction (the z-axis direction) between the gate electrode 7 and the well regions and to expand the channel widths. Thus, the channel resistance can be reduced.

Moreover, as shown in FIG. 1I, the distance Lch2 of the second well region 22 in contact with the gate electrode 7 is shorter than the distance Lch1 of the first well region 21 in contact with the gate electrode 7. Accordingly, it is possible to reduce the channel resistance of the second well region 22 and thus to reduce on-resistance of the semiconductor device 101 as a whole.

In the meantime, when the semiconductor device 101 is off, the electric field applied to the second well region 22 is smaller than the electric field applied to the first well region 21. Moreover, the width of the depletion layer region formed in the second well region 22 is smaller than the width of the depletion layer region formed in the first well region 21 and a punch-through is therefore less likely to develop. As a consequence, it is possible to avoid reduction in withstand voltage even when the lateral width of the second well region 22 is small.

Silicon carbide semiconductor devices have a high density of states of channel interfaces, and on-resistance of such a semiconductor device accounts for a major portion of the entire channel resistance. For this reason, a higher effect is obtained in the case where this embodiment is applied to a silicon carbide semiconductor device.

The bottom portion of the first well region 21 reaches the position deeper than the drift region 4, and the second well region 22 is therefore formed in the insulating substrate 1. Accordingly, it is possible to further increase the distance between the second well region 22 and the drain region 5 and thus to reduce the electric field to be applied to the second well region 22 when the semiconductor device 101 is off. Thus, the withstand voltage performance can be improved.

Description of First Modified Example of First Embodiment

Next, modified examples of the first embodiment will be described. Structures of these semiconductor devices are the same as the structure in FIGS. 1A to 1D. A first modified example is different from the above-described first embodiment in that the impurity concentration of the second well region 22 shown in FIGS. 1A to 1D is set lower than the impurity concentration of the first well region 21 therein. A manufacturing method thereof is the same as the manufacturing method depicted in the first embodiment and a description of the manufacturing method will therefore be omitted.

Since the impurity concentration of the second well region 22 is lower than the impurity concentration of the first well region 21 in the semiconductor device according to the first modified example, it is possible to reduce the threshold value of the gate voltage in order to turn on the channels, thereby reducing a loss.

Description of Second Modified Example of First Embodiment

Figure 2:
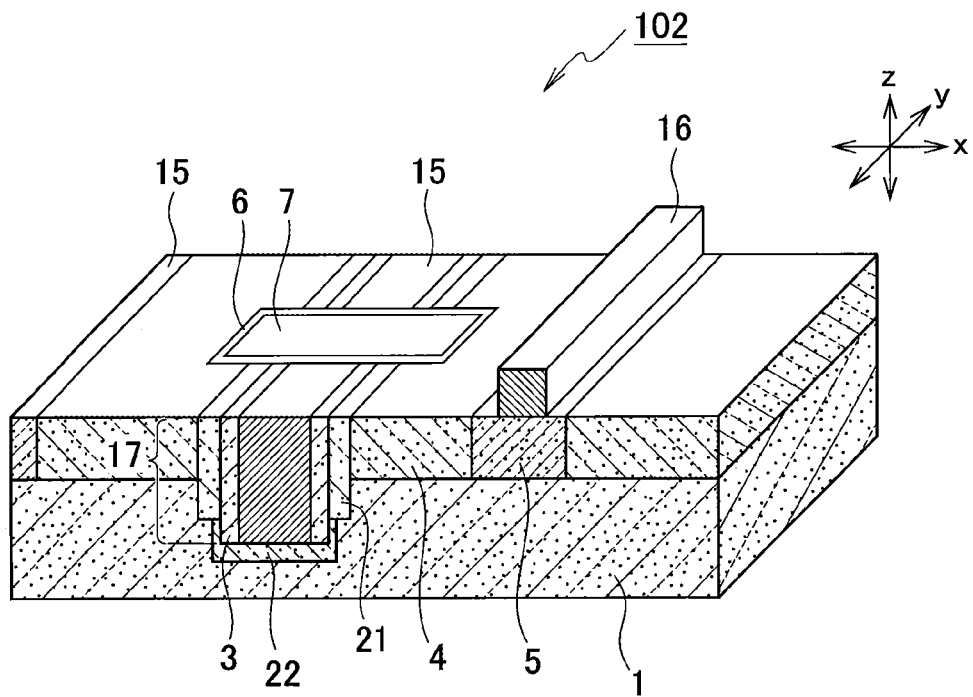
FIG. 2 is a perspective view showing a configuration of a semiconductor device according to a second modified example of the first embodiment of the present invention.

FIG. 2 is a perspective view showing a configuration of a semiconductor device 102 according to a second modified example of the first embodiment. As compared to FIG. 1A shown in the above-described first embodiment, this example is different in that a source groove 17 is formed in conformity to a y-axis direction of the source region 3 in such a way as to penetrate the source region 3. Specifically, the source groove 17 is formed in the source region 3 in such a way as to extend from a second principal surface in a direction perpendicular to the second principal surface, and to penetrate the source region 3 in a direction orthogonal to a direction parallel to the second principal surface and oriented from the source electrode 15 to the drain electrode 16.

A lower end portion of the source groove 17 is formed to a position shallower than the lower end portion of the second well region 22. The source electrode 15 made of a metal material such as Ti, Ni, and Mo is formed inside the source groove 17.

As compared to the above-described semiconductor device 101 shown in FIG. 1A, a method of manufacturing the semiconductor device 102 according to the second modified example has different steps of forming the source groove 17, the first well region 21, the second well region 22, and the source region 3. Details will be described below.

In the second modified example, the source groove 17 is formed after the formation of the drift region 4 and in accordance with the same method as the method of forming the gate groove 8 discussed above. Thereafter, the second well region 22 is formed by oblique ion implantation into a side wall of the source groove 17. An implantation angle in this process is defined as $\theta 2$.

Next, the first well region 21 is formed by oblique ion implantation into the side wall of the source groove 17 in accordance with the same method as the method of forming the second well region 22. An implantation angle in this process is defined as $\theta 1$. Here, the implantation energy for the first well region 21 is preferably set equal to the implantation energy for the second well region 22. As for the implantation angle, $\theta 1$ is preferably set larger than $\theta 2$. The impurities to be implanted and the impurity concentrations are the same as those in the above-described first embodiment.

In this instance, a region of the first well region 21, which overlaps the second well region 22 when viewed in a normal direction to surfaces (second principal surfaces) of the well regions, is formed simultaneously with the second well region 22. In forming the first well region 21, only the region other than the region formed simultaneously with the second well region 22 is formed by the ion implantation. It is possible to carry out the ion implantation easily and to reduce costs by forming the well regions in accordance with the above-described procedures.

Next, the source region 3 is formed by oblique ion implantation into the side wall of the source groove 17. The impurity to be implanted and the impurity concentration are the same as those in the above-described first embodiment.

In the semiconductor device 102 of the second modified example, the provision of the source groove 17 makes it possible to form the first well region 21 and the second well region 22 by the oblique ion implantation. Accordingly, it is possible to form the well regions deeper than those in the case of conducting the ion implantation in the perpendicular direction from the surface of the substrate 1. As a consequence, it is possible to expand the channel width and thus to reduce the channel resistance.

Moreover, by forming the source electrode 15 of the metal such as Ti, Ni, and Mo inside the source groove 17, it is possible to reduce source resistance and thus to provide a semiconductor device with a lower loss.

Meanwhile, in the course of forming the first well region 21 and the second well region 22, the region of the first well region 21 overlapping the second well region 22 when viewed in the normal direction to the second principal surfaces is formed simultaneously with the second well region 22. Thus, the well regions can be formed by using less implantation energy. Furthermore, it is possible to form the well regions easily and to reduce costs.

Description of Second Embodiment

Figure 3A:
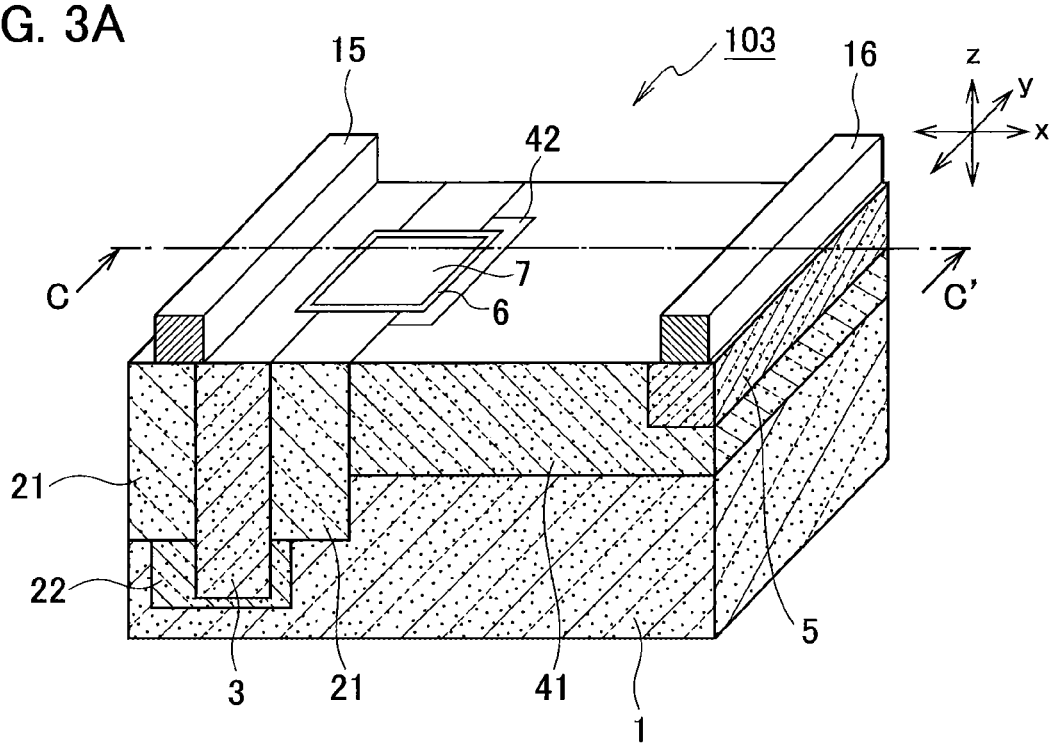
FIG. 3A is a perspective view showing a configuration of a semiconductor device according to a second embodiment of the present invention.
Figure 3B:
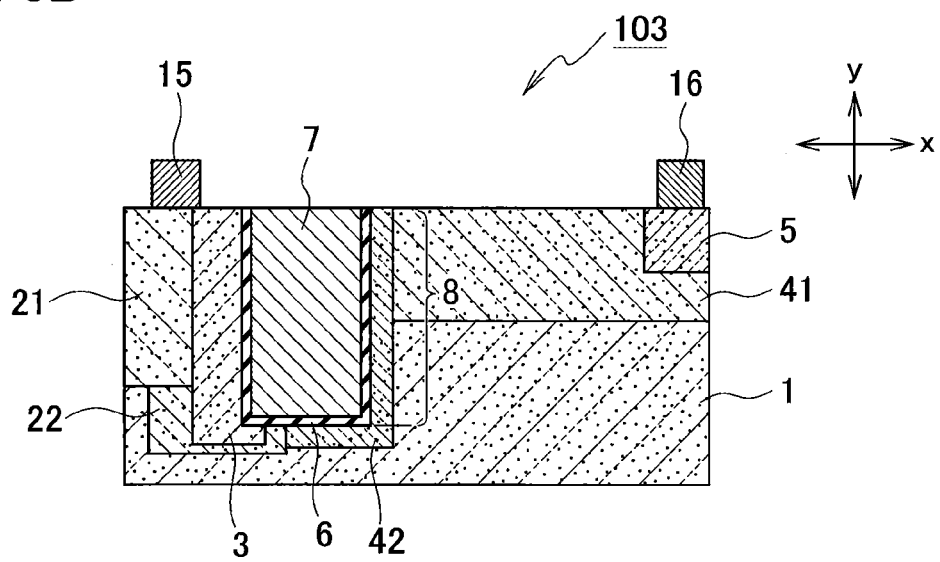
FIG. 3B is a cross-sectional view of the semiconductor device shown in FIG. 3A, which is taken along the C-C' line therein.

Next, a second embodiment of the present invention will be described. FIG. 3A is a perspective view showing a configuration of a semiconductor device 103 according to a second embodiment, and FIG. 3B is a cross-sectional view taken along the C-C line in FIG. 3A. As with FIGS. 1C and 1D described above, illustration of the interlayer insulating film 10 and the contact holes 11 is omitted in FIGS. 3A and 3B in order to avoid complication.

The semiconductor device 103 according to the second embodiment includes the substrate 1 made of insulating semiconductor such as silicon carbide. An N-type first drift region 41 is formed on a principal surface (an upper principal surface in FIG. 3A) of the substrate 1. Moreover, the P-type first well region 21 is formed in contact with the first drift region 41. The bottom portion of the first well region 21 is formed deeper than the first drift region 41.

Meanwhile, the first well region 21 is formed on one end portion side (on a left side in the drawing) in one direction (an x-axis direction in FIG. 3A) parallel to a second principal surface of the first drift region 41. Moreover, there is also provided the second well region 22, which is disposed at a portion inside the substrate 1 located below the bottom portion of the first well region 21. The second well region 22 is formed such that its lateral width is shorter than that of the first well region 21.

An N-type second drift region 42 is formed in the first drift region 41 in the vicinity of a position in contact with the first well region 21. As shown in FIG. 3B, the second drift region 42 is formed deeper than the first drift region 41. A lower end portion of the second drift region 42 is formed deeper than the gate groove 8.

The $N^+$-type source region 3 is formed inside the first well region 21 in such a way as to extend in the perpendicular direction from the surface (the second principal surface) of the first well region 21. The source region 3 is formed to reach a position deeper than the bottom portion of the first well region 21 and shallower than the bottom portion of the second well region 22. In other words, the source region 3 extends in the perpendicular direction from the region of the second principal surface where the first well region 21 is formed, and reaches the second well region 22.

The $N^+$-type drain region 5 is formed (disposed) at the end portion (the end portion on the right side in the drawing) in one direction parallel to the second principal surface and on the opposite side of the source region 3 in such a way as to extend in a perpendicular direction from a second principal surface of the first drift region 41. In other words, the $N^+$-type drain region 5 extending in the perpendicular direction from the second principal surface is formed in the first drift region 41 away from the first well region 21 and the second well region 22.

The gate groove 8 that takes on a rectangular shape when viewed from immediately above is formed at a region extending across the second drift region 42, the first well region 21, and part of the source region 3. The lower end portion of the gate groove 8 reaches the second well region 22. Specifically, the gate groove 8 has a side surface exposed to the first well region 21, the second well region 22, the source region 3, the first drift region 41, and the second drift region 42. Moreover, the gate insulating film 6 is formed on the side surfaces of the gate groove 8. Meanwhile, the lower end portion of the gate groove 8 is located at a position shallower than the lower end portions of the source region 3 and the second well region 22. As a consequence, the gate insulating film 6 provided on the side surfaces of the gate groove 8 is in contact with the first well region 21, the second well region 22, the source region 3, the first drift region 41, and the second drift region 42.

The gate electrode 7 is formed inside the gate groove 8 through the gate insulating film 6. As a consequence, the gate electrode 7 is in contact with the first well region 21, the second well region 22, the source region 3, the first drift region 41, and the second drift region 42 through the gate insulating film 6.

As with the above-described first embodiment, the area of the gate groove 8 in contact with the first well region 21 and the second well region 22 is larger as the depth of the gate groove 8 is larger. Moreover, in the direction (the x-axis direction in the drawing) parallel to the principal surface of the substrate 1, the length of the surface of the first well region 21 in contact with the gate insulating film 6 provided on the side surface of the gate groove 8 is larger than the length of the surface of the second well region 22 in contact with the gate insulating film 6 provided on the side surface of the gate groove 8 (see Lch1 and Lch2 in FIG. 1I).

The source electrode 15 is formed in such a way as to come into contact with the surfaces of the first well region 21 and the source region 3. In other words, the first well region 21 and the source region 3 are set to the same electric potential. The $N^+$-type drain region 5 is formed at an end portion (an end portion on a right side in the drawing) of the first drift region 41. Moreover, the drain electrode 16 is formed in such a way as to come into contact with the surface of the drain region 5. Here, as mentioned above, illustration of the interlayer insulating film 10 and the contact holes 11 (see FIG. 1A) is omitted in FIGS. 3A and 3B.

Method of Manufacturing Semiconductor Device According to Second Embodiment

Next, a description will be given of a method of manufacturing the semiconductor device 103 according to the second embodiment. First, a mask material (not shown) is formed on the substrate 1 and patterned in order to form the gate groove 8 on a non-doped silicon carbide insulating semiconductor substrate (the substrate 1). A silicon oxide film can be used as the mask material while a thermal CVD process or a plasma CVD process can be used as a deposition method.

A general photolithography process can be used as a patterning method. The mask material is etched by using the patterned resist as a mask. Wet etching employing hydrofluoric acid or dry etching such as reactive ion etching can be used as an etching method.

Figure 3C:
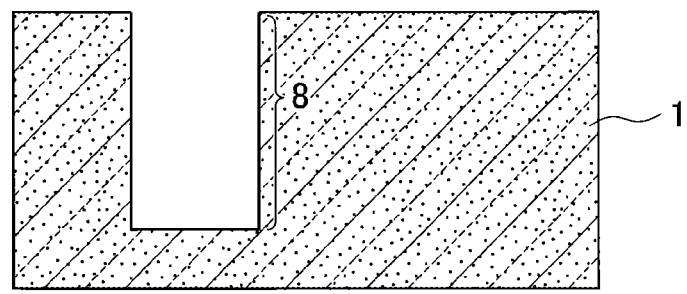
FIG. 3C is a cross-sectional view related to the second embodiment, which shows a state of forming a gate groove in a substrate.

Then, the gate groove 8 is formed by using the mask material as a mask. A dry etching process can be used as a method of forming the gate groove 8. The mask material is removed after forming the gate groove 8. When the mask material is the silicon oxide film, for example, the mask material is removed by hydrofluoric acid washing. As a consequence, the substrate 1 provided with the gate groove 8 can be obtained as shown in FIG. 3C.

Next, the first drift region 41 and the second drift region 42 are formed on the substrate 1. The first drift region 41 and the second drift region 42 can be formed simultaneously by implanting N-type impurity ions by the oblique ion implantation.

Figure 3D:
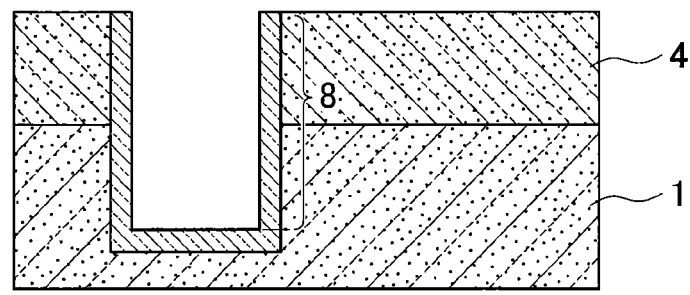
FIG. 3D is a cross-sectional view related to the second embodiment, which shows a state of forming a first drift region and a second drift region subsequent to FIG. 3C.

An implantation concentration of the impurity ions is preferably set in a range from $1 \times 10^{14}$ to $1 \times 10^{18}$ cm$^{-3}$. The implantation energy is set depending on the depths of the first drift region 41 and the second drift region 42. For example, when the depth of the first drift region 41 is 1 μm, implantation of the N-type impurity ions is required in mega-electron-volt (MeV) order. As a consequence, the first drift region 41 and the second drift region 42 are formed on the upper surface of the substrate 1 as shown in FIG. 3D.

Thereafter, the first well region 21, the second well region 22, the N-type source region 3, and the N-type drain region 5 are formed by ion implantation from the surface (the second principal surface) of the first drift region 41. The source region 3 and the drain region 5 are formed simultaneously. In this instance, a mask material is formed on the first drift region 41 and the second drift region 42 for patterning ion implantation regions.

A silicon oxide film can be used as the mask material while a thermal CVD process or a plasma CVD process can be used as a deposition method.

Next, a resist is patterned on the mask material (not shown). A general photolithography process can be used as a patterning method. The mask material is etched by using the patterned resist as a mask. Wet etching employing hydrofluoric acid or dry etching such as reactive ion etching can be used as an etching method.

Thereafter, the resist is removed by using oxygen plasma, sulfuric acid, and the like. P-type and N-type impurities are ion implanted by using the mask material as a mask, thus forming the P-type first well region 21, the P-type second well region 22, and the N$^+$-type source region 3.

Aluminum or boron can be used as the P-type impurity. Meanwhile, nitrogen can be used as the N-type impurity. In this instance, development of crystal defects in the implantation regions can be suppressed by conducting the ion implantation while heating a base at a temperature of about 600° C.

The second well region 22 can be formed at the deeper position than the first well region 21 by setting the implantation energy when forming the second well region 22 higher than the implantation energy when forming the first well region 21.

Moreover, since the lateral width of the second well region 22 is made shorter than the lateral width of the first well region 21 as described above, it is possible to reduce the implantation energy when forming the well regions.

Figure 3E:
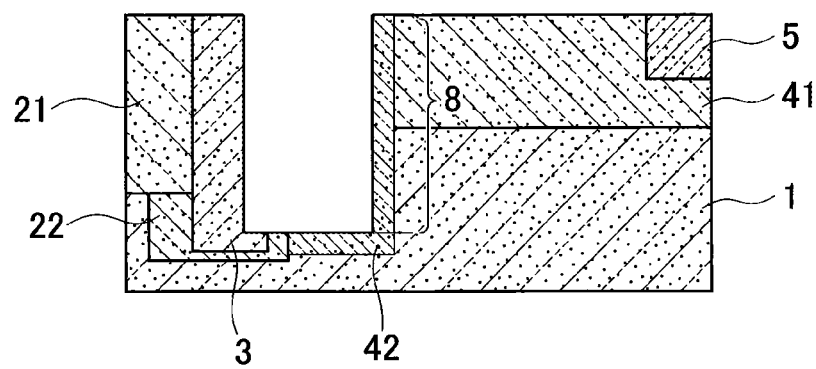
FIG. 3E is a cross-sectional view related to the second embodiment, which shows a state of forming well regions, a source region, and a drain region subsequent to FIG. 3D.

An impurity concentration in each of the first well region 21 and the second well region 22 is preferably set in a range from $1 \times 10^{16}$ cm$^{-3}$ to $5 \times 10^{18}$ cm$^{-3}$. After the ion implantation, the mask material is removed by etching while using hydrofluoric acid or the like. FIG. 3E shows a cross-sectional view in a state after the first well region 21, the second well region 22, the source region 3, and the drain region 5 are formed.

Meanwhile, each of the source region 3 and the drain region 5 formed in accordance with the above-described method preferably has the impurity concentration in a range from $1 \times 10^{18}$ cm$^{-3}$ to $1 \times 10^{21}$ cm$^{-3}$. Moreover, each of the first well region 21 and the second well region 22 preferably has the impurity concentration in a range from $1 \times 10^{15}$ cm$^{-3}$ to $1 \times 10^{19}$ cm$^{-3}$. The depth is preferably set deeper than the gate groove 8.

Thereafter, the ion implanted impurities are activated by conducting a heat treatment. A heat treatment temperature is preferably set to a temperature around 1700° C. It is preferable to use argon or nitrogen as an atmosphere.

Figure 3F:
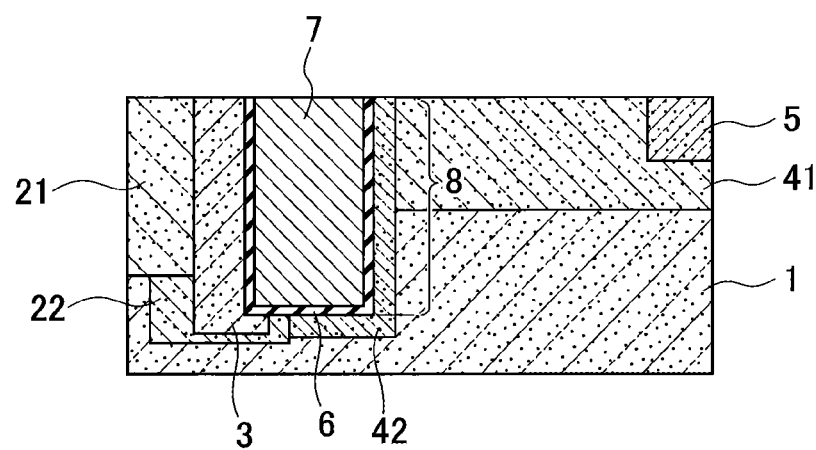
FIG. 3F is a cross-sectional view related to the second embodiment, which shows a state of forming a gate insulating film and a gate electrode subsequent to FIG. 3E.

Thereafter, the gate insulating film 6 and the gate electrode 7 are formed in accordance with the methods similar to those in the above-described first embodiment. FIG. 3F shows a cross-sectional view in a state where the gate electrode 7 is deposited into the gate groove 8. Furthermore, the interlayer insulating film 10, the contact holes 11, the source electrode 15, and the drain electrode 16 are formed. Thus, the semiconductor device 103 according to the second embodiment shown in FIG. 3 is finished.

Description of Operations of Second Embodiment

Next, operations of the semiconductor device 103 according to the second embodiment will be described. The semiconductor device 103 having the configuration shown in FIG. 3A functions as a transistor by controlling an electric potential of the gate electrode 7 in a state where a positive electric potential is applied to the drain electrode 16 based on an electric potential of the source electrode 15.

Specifically, when a voltage between the gate electrode 7 and the source electrode 15 is set equal to or above a predetermined threshold voltage, an inversion layer is formed on each of channels of the first well region 21 and the second well region 22 in contact with the side surfaces of the gate electrode 7 through the gate insulating film 6. Hence, the semiconductor device 103 is set to an on-state. Accordingly, a current flows from the drain electrode 16 to the source electrode 15.

To be more precise, electrons flow from the source electrode 15 to the source region 3, and moreover, flow from the source region 3 to the second drift region 42 through the channels formed in the first well region 21 and the second well region 22. Furthermore, the electrons flow from the first drift region 41 to the drain electrode 16 through the drain region 5.

In this instance, since the second well region 22 is formed deeper than the bottom portion of the gate groove 8, it is possible to reduce the channel resistance.

On the other hand, when the voltage between the gate electrode 7 and the source electrode 15 is set below the predetermined threshold voltage, the inversion layers disappear and the semiconductor device 103 is set to an off-state. Accordingly, the current flowing from the drain electrode 16 to the source electrode 15 is shut off. When the semiconductor device 103 is off, a high voltage in a range from several hundred to several thousand volts is applied between the drain electrode 16 and the source electrode 15.

In this instance, since the lateral width of the second well region 22 is smaller than that of the first well region 21, the distance between the second well region 22 and the drain region 5 becomes longer than the distance between the first well region 21 and the drain region 5. For this reason, the electric field applied to the second well region 22 is smaller than the electric field applied to the first well region 21. Meanwhile, the width of the depletion layer region formed in the second well region 22 is smaller than the width of the depletion layer region formed in the first well region 21 and a punch-through is therefore less likely to develop. As a consequence, it is possible to avoid reduction in withstand voltage even when the lateral width of the second well region 22 is small.

Description of Effects of Second Embodiment

The semiconductor device 103 according to the second embodiment can achieve similar effects to those of the above-described first embodiment. Moreover, the depletion layer attributed to p-n junction between the N-type second drift region 42 and P-type first well region 21 spreads when the semiconductor device 103 is on. A region where no electrons flow is formed in part of the second drift region 42 whereby a region where the electrons flow is reduced and resistance is increased as a consequence. However, since the second drift region 42 is formed deeper than the first drift region 41, a flow channel for the electrons after the passage of the channel is widened and the resistance is reduced. In other words, it is possible to reduce the resistance when the device is on as compared to a case of providing only the first drift region 41 without the second drift region 42.

Meanwhile, the source region 3 is formed to the position deeper than the gate groove 8 and formed to the position shallower than the second well region 22. Accordingly, a distance from the source region 3 to the channel formed at the bottom portion of the gate groove 8 becomes shorter than the case where the source region 3 is shallower than the gate groove 8.

Figure 3G:
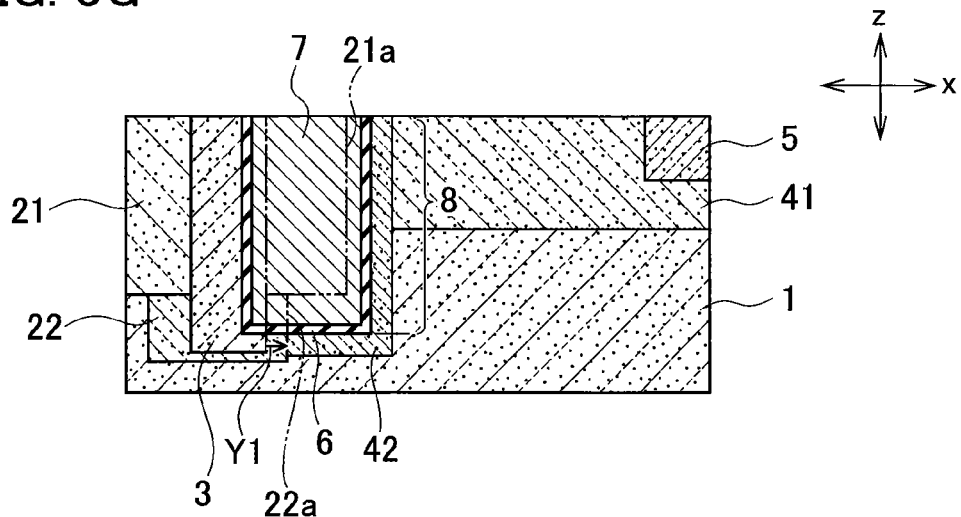
FIG. 3G is an explanatory diagram related to the second embodiment, which shows a flow of a current when the source region is deep.
Figure 3H:
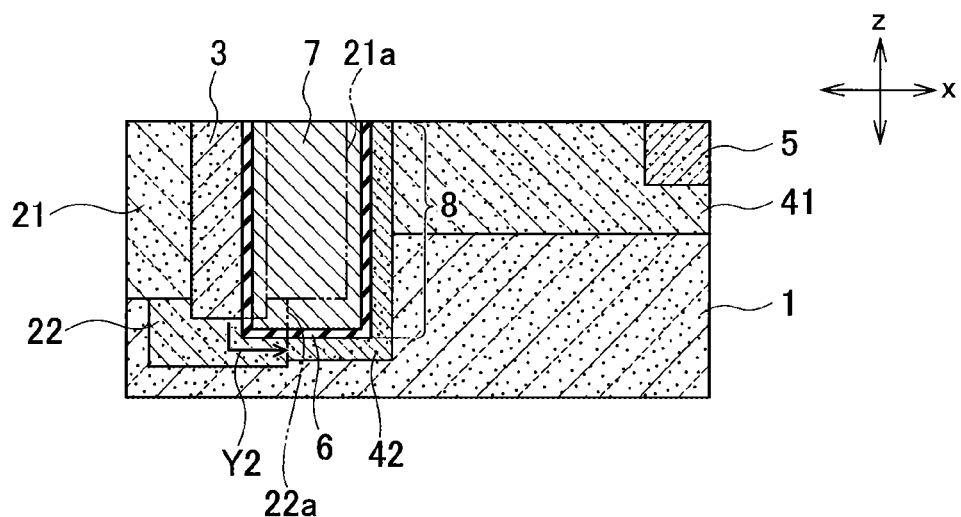
FIG. 3H is an explanatory diagram related to the second embodiment, which shows a flow of a current when the source region is shallow.

Details will be described below with reference to FIGS. 3G and 3H. FIG. 3G shows a cross-sectional view in the case where the source region 3 is deeper than the bottom surface of the gate groove 8 and shallower than the bottom surface of the second well region 22. Meanwhile, FIG. 3H shows a cross-sectional view in the case where the source region 3 is shallower than the bottom portion of the gate groove 8. In the drawing, reference sign 21*a* denotes the region where the first well region 21 overlaps the gate groove 8 in the x-axis direction while reference sign 22*a* therein denotes the region where the second well region 22 overlaps the gate groove 8 in the x-axis direction.

In the configuration shown in FIG. 3G, the distance from the source region 3 to the channel region formed at the bottom portion of the gate groove 8 becomes shorter than that in the configuration shown in FIG. 3H. As indicated with an arrow Y1, the current in the semiconductor device flows from the source region 3 in the order of the channel, the second drift region 42, the first drift region 41, and the drain region 5. On the other hand, in FIG. 3H, the current takes a route indicated with an arrow Y2. Accordingly, the channel resistance can be reduced by adopting the configuration of FIG. 3G.

The lower end portion of the gate groove 8 is shallower than the bottom portion of the second well region 22. Accordingly, a channel region is also formed in the second well region 22 in contact with the lower end portion of the gate groove 8. Thus, it is possible to further reduce the channel resistance.

Moreover, when the gate insulating film in the silicon carbide substrate is formed by thermal oxidation, an oxide film at the bottom portion of the gate groove 8 is formed thin in the case of the substrate currently in use because of a variation in thermal oxidation rate depending on the crystal plane. Accordingly, a threshold voltage of a transistor forming the bottom surface of the gate groove 8 is low so that the bottom surface of the gate groove 8 can achieve even lower channel resistance.

Description of First Modified Example of Second Embodiment

Next, a first modified example of the second embodiment will be described. The structure of the semiconductor device is the same as the structure in FIGS. 3A and 3B. A first modified example is different from the above-described second embodiment in that the impurity concentration of the second well region 22 shown in FIGS. 3A and 3B is set lower than the impurity concentration of the first well region 21. A manufacturing method thereof is the same as the manufacturing method depicted in the second embodiment and a description of the manufacturing method will therefore be omitted.

Since the impurity concentration of the second well region 22 is lower than the impurity concentration of the first well region 21 in the semiconductor device according to the first modified example, it is possible to reduce the threshold value of the gate voltage in order to turn on the channels, thereby reducing a loss.

Description of Second Modified Example of Second Embodiment

Figure 4:
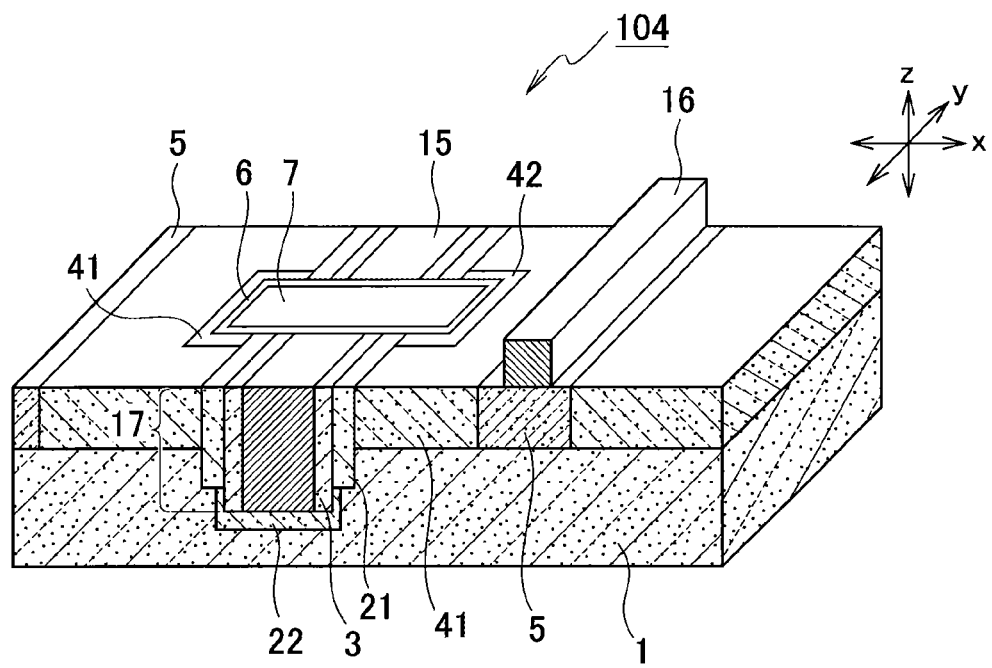
FIG. 4 is a perspective view showing a configuration of a semiconductor device according to a second modified example of the second embodiment of the present invention.

FIG. 4 is a perspective view showing a configuration of a semiconductor device 104 according to a second modified example of the second embodiment. As compared to FIG. 3A shown in the above-described second embodiment, this example is different in that the source groove 17 is formed in conformity to the y-axis direction of the source region 3 in the drawing in such a way as to penetrate the source region 3. Specifically, the source groove 17 is formed in the source region 3 in such a way as to extend from the second principal surface in the direction perpendicular to the second principal surface, and to penetrate the source region 3 in the direction orthogonal to the direction parallel to the second principal surface and oriented from the source electrode 15 to the drain electrode 16.

The lower end portion of the source groove 17 is formed to a position shallower than the lower end portion of the second well region 22. The source electrode 15 made of a metal material such as Ti, Ni, and Mo is formed in the source groove 17.

As compared to the above-described semiconductor device 103 shown in FIG. 3A, a method of manufacturing the semiconductor device 104 according to the second modified example has different steps of forming the source groove 17, the first well region 21, the second well region 22, and the source region 3. Details will be described below.

In the second modified example, the source groove 17 is formed after the formation of the first drift region 41 and the second drift region 42 and in accordance with the same method as the method of forming the gate groove 8 discussed above. Thereafter, the second well region 22 is formed by oblique ion implantation into the side wall of the source groove 17. The implantation angle in this process is defined as θ2.

Next, the first well region 21 is formed by oblique ion implantation into the side wall of the source groove 17 in accordance with the same method as the method of forming the second well region 22. The implantation angle in this process is defined as θ1. Here, the implantation energy for the first well region 21 is preferably set equal to the implantation energy for the second well region 22. As for the implantation angle, and θ1 is preferably set larger than θ2. The impurities to be implanted and the impurity concentrations are the same as those in the above-described second embodiment.

In this instance, the region of the first well region 21, which overlaps the second well region 22 when viewed in the normal direction to the surfaces (the second principal surfaces) of the well regions, is formed simultaneously with the second well region 22. In forming the first well region 21, only the region other than the region formed simultaneously with the second well region 22 is formed by the ion implantation.

Next, the source region 3 is formed by oblique ion implantation into the side wall of the source groove 17. The impurity to be implanted and the impurity concentration are the same as those in the above-described first embodiment.

In the semiconductor device 104 of the second modified example, the provision of the source groove 17 makes it possible to form the first well region 21 and the second well region 22 by the oblique ion implantation. Accordingly, it is possible to form the well regions deeper than those in the case of conducting the ion implantation in the perpendicular direction from the surface of the substrate 1. As a consequence, it is possible to expand the channel width and thus to reduce the channel resistance.

Moreover, by forming the source electrode 15 of the metal such as Ti, Ni, and Mo inside the source groove 17, it is possible to reduce source resistance and thus to provide a semiconductor device with a lower loss.

Meanwhile, in the course of forming the first well region 21 and the second well region 22, the region of the first well region 21 overlapping the second well region 22 when viewed in the normal direction to the second principal surfaces is formed simultaneously with the second well region 22. Thus, the well regions can be formed by using less implantation energy.

The above-described embodiments have explained the example in which the silicon carbide substrate is used as the substrate 1. However, in the present invention, it is possible to use not only the silicon carbide substrate but also substrates made of semiconductor materials having a wide band gap such as GaN, diamond, ZnO, and AlGaN.

Meanwhile, the example of using the N-type polycrystalline silicon as the material of the gate electrode 7 has been described above. However, P-type polycrystalline silicon may be used instead. Alternatively, the gate electrode 7 may adopt other semiconductor materials such as P-type polycrystalline silicon carbide, SiGe, and Al, or conductive materials such as metal materials.

Meanwhile, the example of using the silicon oxide film as the gate insulating film 6 has been described above. However, a silicon nitride film may be used instead. Alternatively, a silicon oxide film and a silicon nitride film may be laminated. In the case of the silicon nitride film, it is possible to perform etching while washing in hot phosphoric acid at 160° C. in the case of isotropic etching.

Although the embodiments of the present invention have been described above, it should be understood that the descriptions and drawings constituting part of this disclosure are not intended to limit this invention. Various alternative embodiments, examples, and operation techniques will become obvious to those skilled in the art from this disclosure.

REFERENCE SIGNS LIST

1 substrate
3 source region
4 drift region
5 drain region
6 gate insulating film
7 gate electrode
8 gate groove
10 interlayer insulating film
11 contact hole
15 source electrode
16 drain electrode
17 source groove
21 first well region
22 second well region
41 first drift region
42 second drift region
71 gate wire
101, 102, 103, 104 semiconductor device

The invention claimed is:

1. A semiconductor device comprising:
    a substrate;
    a first conductivity-type drift region disposed on a principal surface of the substrate;
    a second conductivity-type first well region extending from a second principal surface of the drift region, which is located on an opposite side of a first principal surface of the drift region in contact with the principal surface of the substrate, in a direction perpendicular to the second principal surface and having a bottom portion reaching inside of the substrate;
    a second conductivity-type second well region being in contact with the bottom portion and disposed at a portion inside the substrate located below the bottom portion;
    a first conductivity-type source region extending in the perpendicular direction from a region of the second principal surface provided with the first well region, and reaching the second well region;
    a first conductivity-type drain region extending in the perpendicular direction from the second principal surface in the drift region and away from the first well region and the second well region;
    a gate insulating film in contact with at least a side surface of a gate groove including the side surface exposed to the first well region, the second well region, the source region, and the drift region;
    a gate electrode disposed inside the gate groove through the gate insulating film;
    a source electrode electrically coupled to the source region and the first well region; and
    a drain electrode electrically coupled to the drain region, wherein
    in a direction parallel to the second principal surface and oriented from the source electrode to the drain electrode, a distance of the second well region in contact with the gate insulating film is shorter than a distance of the first well region in contact with the gate insulating film.

2. The semiconductor device according to claim 1, wherein a lower end portion of the gate groove is shallower than a lower end portion of the second well region.

3. The semiconductor device according to claim 1, wherein a lower end portion of the first well region is deeper than the drift region.

4. The semiconductor device according to claim 1, wherein a lower end portion of the source region is deeper than a lower end portion of the gate groove and shallower than a lower end portion of the second well region.

5. The semiconductor device according to claim 1, further comprising:
- a source groove formed in the source region to extend from the second principal surface in a direction perpendicular to the second principal surface, and to penetrate the source region in a direction orthogonal a direction parallel to the second principal surface and oriented from the source electrode to the drain electrode, wherein
- a lower end portion of the source groove is shallower than a lower end portion of the second well region.

6. The semiconductor device according to claim 1, wherein an impurity concentration of the second well region is lower than an impurity concentration of the first well region.

7. The semiconductor device according to claim 1, wherein the drift region includes:
- a first drift region formed on a first principal surface of the substrate; and
- a second drift region formed on the first principal surface of the substrate to come into contact with the first drift region, and formed to a position in the substrate deeper than the first drift region to come into contact with the first well region.

8. A method of manufacturing a semiconductor device provided with
- a substrate,
- a first conductivity-type drift region disposed on a principal surface of the substrate,
- a second conductivity-type first well region extending from a second principal surface of the drift region, which is located on an opposite side of a first principal surface of the drift region in contact with the principal surface of the substrate, in a direction perpendicular to the second principal surface and having a bottom portion reaching inside of the substrate,
- a second conductivity-type second well region being in contact with the bottom portion and disposed at a portion inside the substrate located below the bottom portion,
- a first conductivity-type source region extending in the perpendicular direction from a region of the second principal surface provided with the first well region, and reaching the second well region,
- a first conductivity-type drain region extending in the perpendicular direction from the second principal surface in the drift region and away from the first well region and the second well region,
- a gate insulating film in contact with at least a side surface of a gate groove including the side surface exposed to the first well region, the second well region, the source region, and the drift region,
- a gate electrode disposed inside the gate groove through the gate insulating film,
- a source electrode electrically coupled to the source region and the first well region, and
- a drain electrode electrically coupled to the drain region, the method comprising:
forming the semiconductor device such that, in a direction parallel to the second principal surface and oriented from the source electrode to the drain electrode, a distance of the second well region in contact with the gate insulating film is shorter than a distance of the first well region in contact with the gate insulating film, and that a region of the first well region overlapping the second well region when viewed in a normal direction to the second principal surface is formed simultaneously with the second well region.

* * * * *